United States Patent

[11] 3,615,929

[72] Inventors William M. Portnoy Richardson; Warren P. Waters, Dallas; Emery C. Wisman, Richardson, all of Tex.

[21] Appl. No. 470,456
[22] Filed July 8, 1965
[45] Patented Oct. 26, 1971
[73] Assignee Texas Instruments Incorporated Dallas, Tex.

[54] METHOD OF FORMING EPITAXIAL REGION OF PREDETERMINED THICKNESS AND ARTICLE OF MANUFACTURE
10 Claims, 10 Drawing Figs.

[52] U.S. Cl. 148/175, 29/577, 29/578, 117/106, 117/107.2, 117/201, 117/212, 148/1.5, 148/187, 317/235
[51] Int. Cl. H01l 7/36, C23c 13/00, B02j 17/00
[50] Field of Search 148/1.5, 174, 175, 186, 187; 117/106, 107, 107.2, 201, 212; 29/578, 577; 317/234, 235

[56] References Cited

UNITED STATES PATENTS

| | | | |
|---|---|---|---|
| 3,199,002 | 8/1965 | Martin | 29/577 X |
| 3,206,339 | 9/1965 | Thornton | 148/175 |
| 3,319,138 | 5/1967 | Bergman et al. | 317/235 |
| 3,379,584 | 4/1968 | Bean et al. | 148/1.5 X |
| 3,393,349 | 7/1968 | Huffman | 317/235 X |
| 3,409,483 | 11/1968 | Watson | 148/175 |
| 3,412,460 | 11/1968 | Lin | 29/577 |
| 3,463,975 | 8/1969 | Biard | 317/235 |
| 3,156,591 | 11/1964 | Hale et al. | 148/175 |
| 3,243,323 | 3/1966 | Corrigan et al. | 148/175 |
| 3,280,391 | 10/1966 | Bittmann et al. | 317/234 |
| 3,296,040 | 1/1967 | Wigton | 148/175 |
| 3,386,857 | 6/1968 | Steinmaier | 117/212 |
| 3,388,000 | 6/1968 | Waters et al. | 317/235 |

OTHER REFERENCES

Schwartz et al., " A Stylus Method for Evaluating the Thickness of Thin Films and Substrate Surface Roughness" Transactions of the Eighth Vacuum Symposium Vol. 2, pp. 836- 845, 1962.

Krakauer et al., " Hot Carrier Diodes switch in Picoseconds" electronics pp. 53- 55, July, 1963.

Gaertner et al., " Micropower Circuits" Electronics, pp. 47- 52, July 1963.

*Primary Examiner*—L. Dewayne Rutledge
*Assistant Examiner*—W. G. Saba
*Attorneys*—Samuel M. Mims, Jr., James O. Dixon, Andrew M. Hassell, John E. Vandigriff, Harold Levine and Richards, Harris and Hubbard

ABSTRACT: A process is disclosed for fabricating semiconductor devices in which a patterned oxide film of a predetermined thickness is formed on a semiconductor substrate followed by epitaxially forming on exposed areas of the substrate a layer of semiconductor material having a preselected thickness relative to the thickness of the oxide layer.

INVENTORS:
WILLIAM M. PORTNOY
WARREN P. WATERS
EMERY C. WISMAN

E. Mickey Hubbard
ATTORNEY

INVENTORS:
WILLIAM M. PORTNOY
WARREN P. WATERS
EMERY C. WISMAN

E. Mickey Hubbard
ATTORNEY

METHOD OF FORMING EPITAXIAL REGION OF PREDETERMINED THICKNESS AND ARTICLE OF MANUFACTURE

This invention relates generally to semiconductor devices, and more particularly relates to a method for producing an epitaxial plug of precisely determinable thickness, and to various articles of manufacture which may be fabricated using the method.

It is common practice today in the fabrication of semiconductor devices to form additional monocrystalline semiconductor material upon a monocrystalline semiconductor substrate by epitaxial growth. In general, epitaxial growth provides a means whereby a layer of substantially any desired resistivity and type semiconductor material may be grown on a substrate of the same or different resistivity or the same or different conductivity type. Another advantage is that the epitaxial layer generally has a uniform resistivity across its entire thickness, rather than the graduated resistivity as naturally results from diffusion processes.

In general, use of epitaxial layers was initially limited to devices wherein a layer was formed over the entire substrate, and then active regions subsequently diffused into the epitaxial layer. Techniques have recently been developed for masking the substrate in such a manner as to control the areas in which epitaxial growth occurs by means of a mask such as silicon oxide. Spurious growth of the epitaxial material on the surface of the masking oxide film can be substantially eliminated if the area of the oxide film is reduced to a minimum by using only a peripheral border to define the area in which the epitaxial material is to be grown.

In spite of these advances in the technology of forming epitaxial regions in semiconductor devices, it has remained impossible to measure and thereby control the thickness of the epitaxial layers, particularly when the layers need to be extremely thin because of the physical character of the epitaxial material which is essentially a continuation of the substrate seed. As a result, it has been extremely difficult to precisely design semiconductor devices in such a manner as to approach theoretically optimum performance because the resistivities and thicknesses of the various active regions of the devices cannot be accurately controlled. For example, a Schottky barrier, i.e., a metal-semiconductor diode, is a relatively low noise structure in mixer applications when compared with other types of diodes. However, in order to fully realize the advantages of a Schottky barrier, the zero bias capacitance and series resistance must be low enough to reduce losses and obtain reasonable conversion current. Epitaxial material may be used for the semiconductor portion of the junction. This permits a high resistivity semiconductor layer, which results in a low junction capacity, to be placed on a low-resistivity semiconductor substrate, which provides a low series resistance leading to the cathode contact. Using processes heretofore available, the thickness of the epitaxial layer could not be controlled with any degree of precision primarily because the thickness of the layer could not be measured and device designs were such as to require a relatively thick epitaxial layer. As a result, the thickness of undepleted epitaxial material remaining under the space charge region in an axial structure was great enough to MAKE A SIZABLE CONTRIBUTION TO THE SERIES RESISTANCE, WHICH IS UNDESIRABLE. If the resistivity of the epitaxial layer is reduced to compensate for this additional series resistance, the areal junction capacity of the diode increases, which is also undesirable. If the total capacitance is reduced by reducing the junction area, higher series and spreading resistance occurs.

A similar problem is encountered in the fabrication of transistors and integrated circuits in that the thickness of very thin epitaxial layers cannot be precisely controlled. For example, in the fabrication of a transistor, it is desirable to precisely control both the base width or thickness and the concentration of impurities in the base. In most transistor constructions, the base width is determined by the difference in the depths of the base and emitter region and the impurity concentration varies over the entire width of the base region as a result of the diffusion gradient. Similar problems exist in the fabrication of integrated circuits wherein transistors, diodes and other semiconductor devices are all fabricated on a single substrate.

An important object of this invention is to provide a process for precisely controlling the thickness of a very thin epitaxial layer formed in a preselected area on the surface of a substrate.

Another object of the invention is to provide an improved metal-semiconductor diode construction in which high-resistivity semiconductor material is so thin that the depletion region extends through the high-resistivity region to a low-resistivity substrate, thereby reducing the series resistance to essentially zero.

Another object of the invention is to provide a diode which has a flat capacitance-voltage curve with a low series resistance until the forward voltage reaches a level.

A further object of the invention is to provide an improved germanium transistor or the like.

Still another object of the invention is to provide an integrated circuit wherein a metal-semiconductor diode is connected in series with the base of a transistor.

Yet another object of the invention is to provide an integrated circuit device in which a metal-semiconductor diode shunts the base-collector junction of a PNP transistor so as to prevent forward bias of the base-collector junction and thereby speed switching of the transistor.

These and other objects are accomplished in accordance with the present invention by means of a process in which an oxide film is formed on the surface of a monocrystalline semiconductor substrate to a preselected thickness. This thickness can be precisely measured to within a few hundred angstroms by comparing the color of the film to color charts, and to within a few angstroms by using interferometer techniques. These measurements may be accomplished without damage to the oxide film. Precise measurement permits precise control of the thickness of the film by adjustment of the process parameters. The oxide film is then patterned by conventional photolithographic techniques to expose the substrate in predetermined areas. The oxide film is also removed in all inconsequential areas so that only a strip of the oxide film remains to define the periphery of the predetermined area. Epitaxial material is then deposited over the areas of the semiconductor substrate which are exposed through the oxide film until it reaches a thickness corresponding approximately to the thickness of the oxide film, which thickness is precisely known. The oxide film serves as a fiducial thickness marker from which the precise thickness of the epitaxial layer can be determined by simple mechanical techniques without damage to the epitaxial layer. The parameters of the epitaxial process can then be selected so as to precisely control the thickness. Thus the ability to measure the thickness of each epitaxial layer, or randomly selected layers from a production batch, by an inexpensive and precise method, without damage to the device, permits the precise control of the thickness of the epitaxial layer by adjustment of the process parameters.

In the fabrication of a diode in accordance with this invention, a thin, high-resistivity epitaxial layer if formed on a low-resistivity substrate in a confined area as described above. A second oxide film, or other insulating layer, is then deposited over the epitaxial layer. An aperture is then cut in the second oxide layer and a nonalloying metal film deposited over the aperture to form a metal-semiconductor diode. In accordance with an important aspect of the invention, the epitaxial material is high resistivity and has a thickness equal to or less than the normal depletion width of the high-resistivity epitaxial material so as to provide an essentially zero series resistance and flat capacitance-voltage behavior until the forward voltage has reached a predetermined level sufficient to reduce the depletion width to a distance less than the thickness of the epitaxial layer. Further, the epitaxial layer is preferably relatively high resistant material so as to have a low areal junction capacity.

In accordance with another aspect of the invention, a transistor having a predetermined base width and a substantially constant diffusion gradient is fabricated by forming an epitaxial layer on a substrate of a predetermined thickness to form the base region. A precisely controlled, very shallow emitter diffusion may be made into the epitaxial region, or a second epitaxial layer grown, to form the emitter.

In accordance with another aspect of the invention, a high-speed switching device comprised of a PNP transistor and a metal-semiconductor diode connected form collector to base is fabricated by growing a high-resistivity N-type epitaxial plug of predetermined thickness on an N-type base region of greater conductivity. A metallized film which will form an ohmic contact with low-resistivity semiconductor material and rectifying contact with high-resistivity material is then deposited over a patterned oxide film to make the diode junction. The metallized film is then patterned to make the necessary expanded contacts or interconnecting conductors.

The novel features believed characteristic of this invention are set forth in the appended claims. The invention Itself however, as well as other objects and advantages thereof, may best be understood by reference to the following detailed description of illustrative embodiments, when read in conjunction with the accompanying drawings, wherein:

Figure 6:
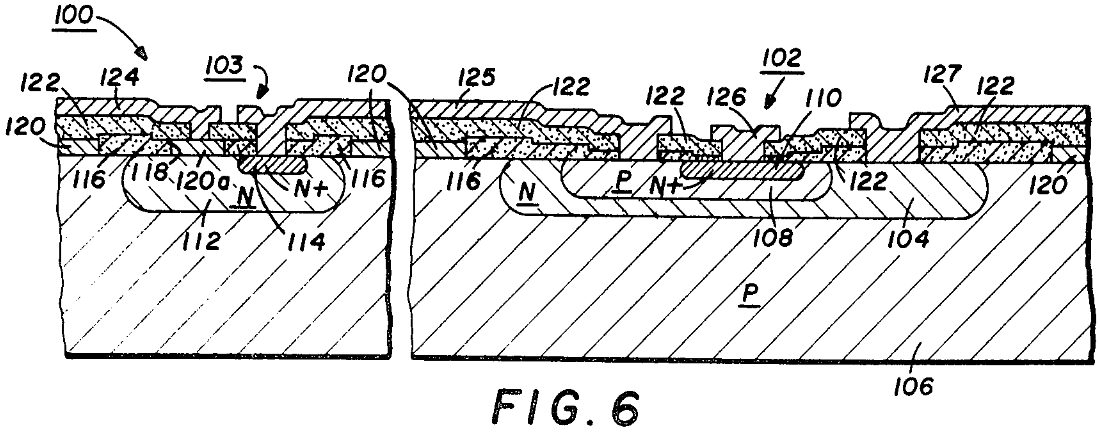
FIG. 6 is an enlarged, somewhat schematic sectional view illustrating an integrated circuit fabricated using the method of this invention.
Figure 7:
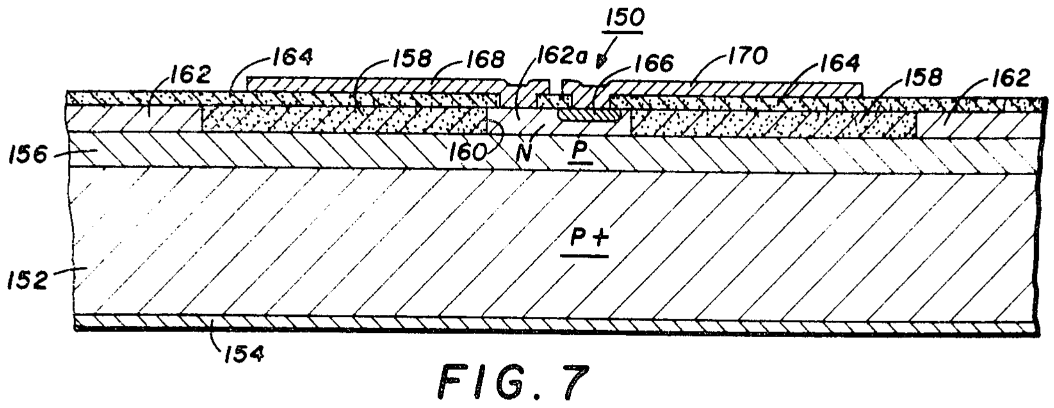
Figure 8:
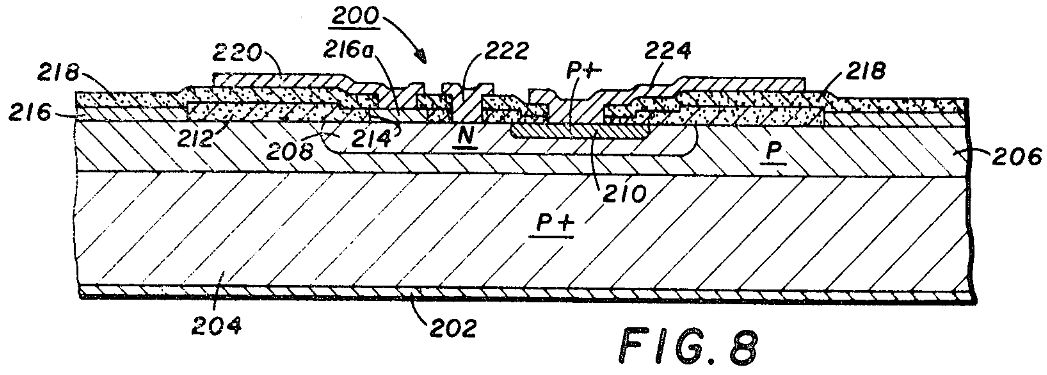
Figure 8A:
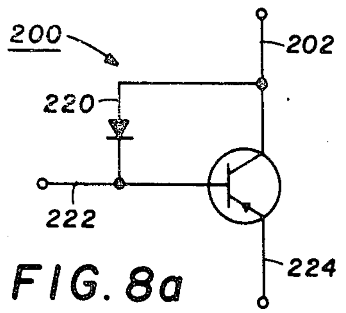
Figure 6A:
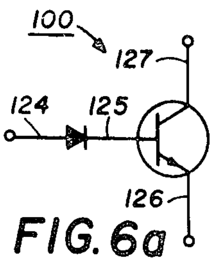

FIG. 6*a* is an equivalent circuit diagram of the device of FIG. 6;

FIG. 7 is an enlarged, somewhat schematic sectional view of a transistor fabricated by the method of this invention;

FIG. 8 is an enlarged, somewhat schematic sectional view of a high-speed switching device fabricated using the method of this invention; and FIG. 8*a* is an equivalent circuit diagram of the switching device of FIG. 8.

Figure 1:
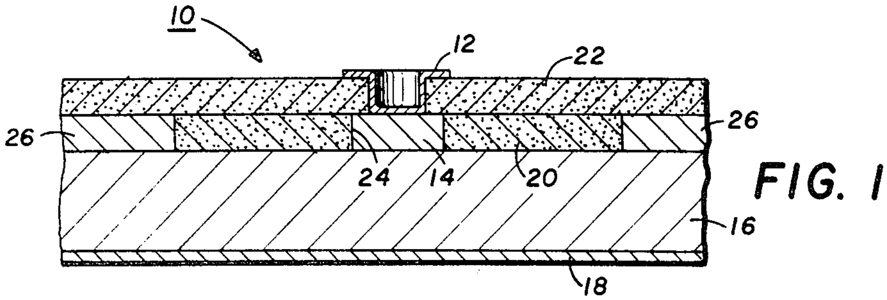
FIG. 1 is an enlarged, somewhat schematic sectional view of a diode constructed in accordance with the present invention, which also serves to illustrate the method of the present invention.

Referring now to the drawings, and in particular to FIG. 1, a metal-semiconductor diode, commonly referred to as a Schottky barrier, constructed in accordance with the present invention, is indicated generally by the reference numeral 10. The rectifying junction is formed between a metal film 12 and a high-resistivity N-type epitaxial plug 14. The metal film 12 serves as the expanded anode contact. The epitaxial plug 14 is grown on a monocrystalline, relatively low resistivity substrate 16 and a second metallized film 18 over the opposite side of the substrate 16 serves as the cathode contact. A thermally grown oxide film 20 provides edge isolation for the epitaxial plug 14, in addition to serving as an epitaxial growth mask as hereafter described, and a relatively thick deposited oxide film 22 increases the separation between the low-resistivity substrate and the anode metal film 12 to reduce the stray capacitance of the diode as will presently be described.

In accordance with an important aspect of this invention, the epitaxial plug 14 which forms the cathode is high-resistivity material and has a precisely controlled thickness equal to or less than the depletion width calculated for the particular resistivity The high-resistivity material makes the areal junction capacity very low. If the thickness of the epitaxial material 14 is less than the depletion width, the depletion region extends all the way to the surface of the low-resistivity substrate 16, leaving no undepleted epitaxial material. This results in essentially zero series resistance for the epitaxial material. Further, if the thickness of the epitaxial plug 14 is made less than the normal depletion width, the effective depletion width will then be equal to the thickness of the epitaxial material. Then the capacitance-voltage will remain essentially flat until the forward voltage across the diode is sufficiently high to reduce the natural depletion width to a value less than the epitaxial thickness. Since the epitaxial material 14 is very thin, there is a certain amount of autodoping from the substrate material which occurs during the epitaxial growth. This decreases the resistivity of the epitaxial material and places an upper limit on the resistivity of the epitaxial material which can be obtained.

In fabricating the diode 10 using the process of the present invention, an oxide film is formed on the low-resistivity, monocrystalline, N-type semiconductor substrate 16. The oxide is preferably thermally grown, although other types of oxides may be employed if desired or necessary to protect previous diffusions or other structure. In most cases, however, a thermal oxide may be used because the impurity redistributions occurring at the high temperatures do not affect subsequent device behavior and are therefore not important. The thickness of the oxide film is chosen to be substantially equal to the desired thickness of the epitaxial plug 14 and the thickness may be precisely determined by nondestructive techniques to within error limits far more precise than are required. For example, the thickness of the oxide can be determined by visual inspection for color to within about ±100 angstroms, and can be determined to within a few angstroms by using conventional interferometer techniques. The important aspect is that the oxide film can be measured in this manner without damage to the oxide so that the thickness can be monitored at an intermediate point in the fabrication of the device.

Figure 2:
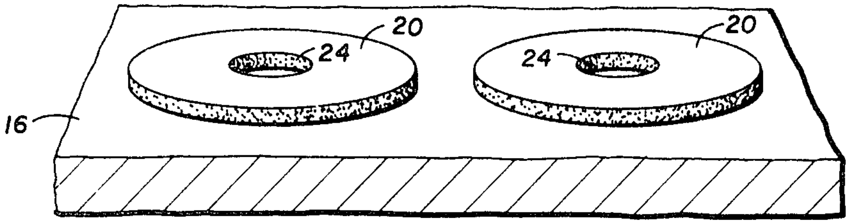
FIG. 2 is an enlarged, somewhat schematic perspective view illustrating a step in the novel method of fabricating the diode illustrated in FIG. 1.

Next, the oxide film is patterned as illustrated in FIG. 2, using conventional photolithographic techniques so as to remove the oxide film and expose the substrate 16 in the predetermined areas in which the epitaxial layer or plug 14 is to be deposited. It is important that all excess oxide be removed except that necessary to peripherally define the area in which the epitaxial plug is to be deposited and that necessary to prevent shorting of the active regions of the device. It is important to remove all excess oxide which is not required to define the periphery of the preselected area so as to prevent spurious growth of the epitaxial material upon the surface of the oxide. In general, it is believed that spurious epitaxial growth on the surface of the oxide 20 is prevented by reason of the fact that the epitaxial material migrates along the surface of the oxide until it finds its way to the substrate 16, unless the epitaxial material first encounters an anomaly in the surface of the oxide film 20 in which it can collect. By reducing the surface area of the oxide 20 to the minimum required to define the areas 24 and to perform whatever electrical isolation function is required of the oxide layer, the chances that the epitaxial material will take root in anomaly are substantially reduced. It is also believed that this phenomenon results in a less rapid growth of the epitaxial layer after the epitaxial layer has reached the thickness of the oxide layer which reduces the cruciality of stopping the epitaxial deposition at a precise moment in order to obtain the desired thickness.

Next, high-resistivity N-type material is epitaxially grown on the exposed surface of the semiconductor substrate 16. The epitaxial material grown in the limited area defined by the central openings 24 forms the plug 14. The excess epitaxial material 26 grown on the remaining exposed surface of the substrate 16 is of no consequence in the function of the semiconductor devices. After the epitaxial layer has been deposited, the thickness of the layer, and in particular the plug 14, may be checked using conventional mechanical profiling devices such as the machine sold under the trademark Talysurf by Taylor-Hobson, Leicester England a division of The Rank Organization. The profile will indicate the thickness of the epitaxial plug relative to the thickness of the oxide layer 20 which serves as the fiducial marker of known thickness to within one micron or less.

Next, the oxide layer 22 is deposited over the substrate using any suitable conventional low-temperature process. A low-temperature process is preferred over a thermal oxide because elevated temperature will cause diffusion into the plug 14 from the substrate and concentration of impurities in the plug at the surface. The oxide layer 22 is made as thick as possible without cracking. There are three conventional insulating layers, glassy layers, thermally grown oxides, and oxides deposited at temperatures lower than those required for thermally grown oxides, which may be used for this purpose and all result in some inoptimum condition. For example, although the glasslike layers can be obtained in substantial thicknesses, these layers cannot be photolithographically patterned with sufficient resolution so that the junctions are limited to relatively large areas. Thermally grown oxides can be obtained in large thicknesses, and have good resolution, but the impurity redistributions occurring at elevated temperatures required for oxide growth often adversely affect other regions of the structure and are therefore undesirable. Deposited oxides have good resolution, but when formed of a sufficient thickness are of poor quality and tend to crack and develop pinholes.

Next, the oxide layer 22 is patterned by conventional photolithographic and etching techniques to open up an aperture in the oxide over the plug 14. Finally, a metallized layer is deposited over the entire substrate and patterned to form the contact 12. It is important that the metal selected for the contact be one that will form a rectifying contact with the plug 14, rather than an ohmic contact. Molybdenum is an example of a suitable metal, and gold may be used if subsequent temperatures are kept below 377° C. if the substrate is silicon. However, it is advantageous to use a layer of molybdenum and a layer of gold. The molybdenum is preferable because it does not alloy with silicon at temperatures ordinarily used in manufacture, it adheres reasonably well to silicon and silicon dioxide, it does not alloy with and is not penetrated by gold, and it can be selectively applied with the evaporation and photoresist masking techniques ordinarily used in semiconductor manufacture. Gold is ideal for the top layer because it is highly conductive so that series resistance is not introduced, it adheres to molybdenum, and it can be easily bonded to with the commonly used small gold wires without the problem of formation of $AuAl_2$ such as is present when aluminum is used as a contact metal.

Diodes using the configuration illustrated in FIG. 1 and the above described method have bee fabricated in which the epitaxial plugs 14 ranged from about 0.020 to about 0.024 mil and were about 1.0 mil in diameter, the diameter of the circular oxide ring 20 was about 10.0 mils, and the deposited oxide films 22 were about 8,000 angstroms thick, thereby providing a total oxide thickness of about 13,000 angstroms. The junction diameter between the metal 12 and epitaxial plug 14, that is the diameter of the hole cut in the deposited oxide layer 22, was slightly less than 1.0 mil. The diodes were tested in packages having a capacity of about 0.16 picofarad. Using these packages, the typical device parameters were:

| | |
|---|---|
| Forward Voltage at 10 ma. | ~ 0.85 v. |
| Reverse Voltage at 10μa. | ~ 11 v. |
| Total Zero Bias Capacitance at 1 mc. | ~ 0.35 pf. |
| Series Resistance | ~ 17 ohms |

Subtracting package capacitance, the total junction capacitance was about 0.19 pf. The series resistance was higher than expected, as was the zero bias capacitance, but the higher values may be explained by the autodoping effect. The devices were designed around 3.0 ohm-cm. epitaxial material, so that the depletion regions would be about 0.02 mil. Lower resistivity material would result in a narrowed depletion region, so that a higher areal capacity and higher series resistance would appear. It is difficult to measure the resistivity of very thin epitaxial material because of mechanical problems, so the resistivity must be back calculated from device parameters. Carrying out this calculation, the epitaxial resistivity accounting for the observed capacity and resistance is about 0.1 to 0.5 ohm-cm.

In addition, microwave mixer diodes have also been fabricated using this technique. The electrical parameters obtained in this case were:

| | |
|---|---|
| Forward Voltage at 10 ma. | ~ 0.85 v. |
| Reverse Voltage at 10μa. | ~ 14 v. |
| Total Zero Bias Capacitance at 1 mc. | ~ 0.8 pf. |
| Noise Figure at 8.3 Gc. | ~ 8–10 db. |
| Rectified Current | ~ 0.2–0.4 ma. |

The higher zero bias capacity for these devices is the result of higher package capacity.

Figure 3:
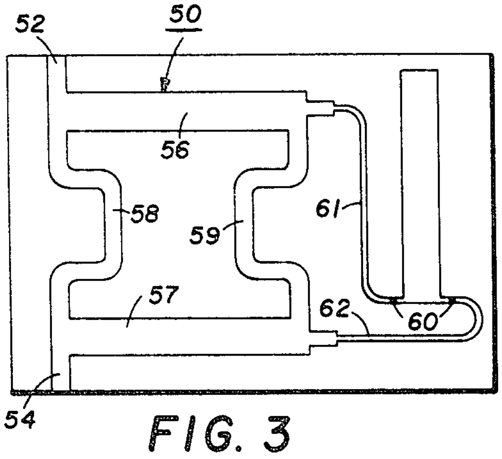
FIG. 3 is an enlarged, somewhat schematic plan view of a hybrid mixer.

Referring now to FIG. 3, an X-band hybrid mixer circuit for mixing a 9 Gc. incoming signal with an 8.5 Gc. local oscillator to produce a 500 mc. IF frequency is indicated generally by the reference numeral 50. The hybrid mixer circuit is formed by metallized strip lines deposited directly on a high-resistivity silicon or intrinsic gallium arsenide substrate with a metallized ground plane formed over the opposite surface. The particular configuration and operation of the hybrid mixer circuit 50 is known in the art and therefore does not, per se, constitute a part of the present invention. In general, interconnecting strip lines 56, 57, 58 and 59 form a 3 db. hybrid conductor pattern where the input signals are mixed, transformed and applied to two diode structures 60 which are located at the ends of ¼-wavelength filter sections 61 and 62 so as to prevent X-band energy from reaching the IF amplifier stage.

Figure 4:
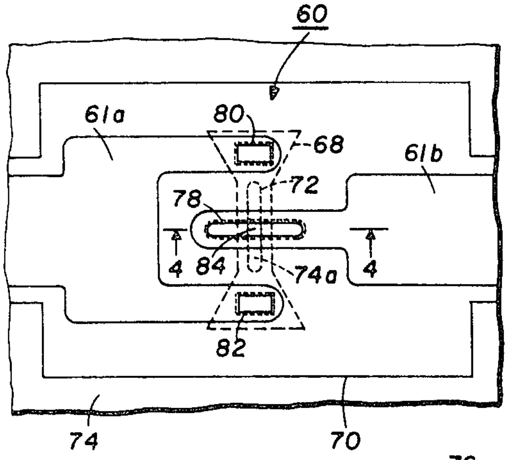
FIG. 4 is an enlarged, somewhat schematic plan view of one of the diodes used in the mixer of FIG. 3 and constructed in accordance with the present invention.
Figure 5:
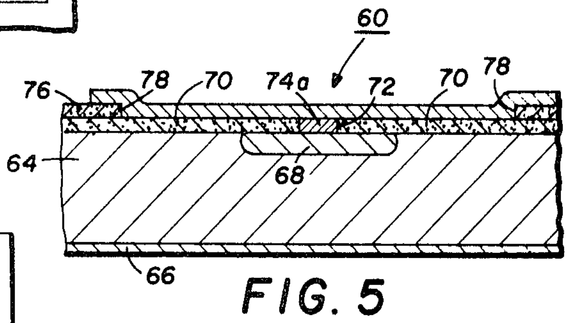
FIG. 5 is an enlarged, somewhat schematic sectional view taken substantially on lines 4–4 of FIG. 4.

The diodes 60 are constructed in accordance with this invention and one diode is illustrated in FIGS. 4 and 5. As can best be seen in FIG. 5, the high resistivity silicon or intrinsic gallium arsenide substrate 64 has a metallized ground plane 66 on one surface. The diode 60 is comprised of a diffused region 68 having a configuration as shown in dotted outline in FIG. 4 which provides low resistivity for ohmic contact with a strip line as will presently be described. An oxide film 70, preferably thermally grown, is formed over the substrate 64 to a thickness corresponding to the thickness desired of the high-resistivity epitaxial plug which is to be deposited. The oxide film 70 is patterned by photolithographic techniques to form a peripheral frame defining an elongated slot 72 as can best be seen in dotted outline in FIG. 4. A high-resistivity epitaxial layer 74 is then deposited over the exposed surface of the substrate around the silicon oxide frame 70 and within the elongated opening 72 to form an elongated epitaxial plug **74*a*. A low-temperature oxide film 76 is then deposited over the substrate and is patterned by a standard photolithographic technique to form one elongated slot 78 extending transversely across the elongated epitaxial plug 74*a*. It is important that the period of time during which the oxide is exposed to the etchant be controlled so that the first oxide layer 70 will not also be etched away. A second photolithographic and etching procedure is then performed to cut openings 80 and 82 through both oxide layers 70 and 76 to expose the opposite ends of the diffused region 68**.

A metal film is then deposited over the substrate and is patterned to form the strip lines **61*a* and 61*b* respectively. The strip lines 61*a* and 61*b* must be of the type which will make ohmic contact with the low-resistivity diffused region 68 while making a rectifying contact wit the high resistivity epitaxial plug 74*a*. This metal may be molybdenum or gold, but is preferably a layer of each as previously described. It will be appreciated that this technique permits an extremely small junction area, defined by the square 84**, between a metal and a high-resistivity semiconductor of controlled thickness and controlled impurity while at the same time providing a surface oriented structure on an intrinsic substrate capable of carrying high-frequency strip lines.

Referring now to FIG. 6, an integrated circuit fabricated by the method of the present invention is indicated generally by the reference numeral 100. The circuit 100 includes a transistor 102 and a metal-semicondcutor diode 103. Both the transistor and the diode have a planar configuration. An equivalent circuit of the device 100 is shown in FIG. 6*a*. The transistor 102 is of conventional construction and comprises an N-type collector diffusion 104 which is made in a P-type substrate 106, a P-type base region 108 diffused into the collector region 104, and finally an N-type emitter region 110 diffused into the base region. An N-type region 112 is diffused at the same time that the N-type collector region 104 is diffused, and a lower resistivity N-type region 114 is diffused when the emitter region 110 is diffused. During the diffusion processes, an oxide film 116 is thermally grown on the silicon substrate 106 the thickness of which can be precisely determined. The oxide film 116 may then be increased in thickness if necessary, but in any event serves as the fiducial thickness marker from which the thickness of the epitaxial layer which is to be deposited can be controlled. The oxide layer 116 is then patterned to form an opening 118 over the surface of the N-type region 112 and to remove the oxide in all areas where epitaxial material formed on the substrate 106 will be of no consequence. It will be noted, however, that the oxide film 116 completely covers the N-type region 112 and the N-type collector region 104 of the transistor 102, although the two areas are separated. Next, an epitaxial layer 120 is formed on the substrate. As previously described, the epitaxial material is deposited only on the exposed surface of the P-type substrate 106 and does not grow on the oxide layer 116. An epitaxial plug 120*a* of predetermined thickness is formed in the opening 118, and the thickness can be precisely determined and controlled from the fiducial thickness marker provided by the oxide film. A second low-temperature oxide layer 122 is then formed over the entire substrate and patterned to expose contact areas over the epitaxial plug 120*a*, the low-resistivity N-type region 114, the base region 108, the emitter region 110, and the collector region 104 as illustrated. A metallized film is then deposited over the entire substrate and patterned to provide interconnecting conductors and expanded contacts. The metallized film must be selected so as to make ohmic contact with the relatively low resistivity semicondcutor regions while making rectifying contact with the high-resistivity epitaxial plug 120*a*. Examples of the metals which may be used are gold and molybdenum, or layers of each as heretofore described.

Thus the metallized films 124–127 form the conductors illustrated by corresponding reference numerals in the schematic circuit diagram of FIG. 6*a*. The diode 103 has a rectifying junction between the metal film strip 124 and the epitaxial plug 120*a*. The epitaxial plug 120*a* may have a high resistivity and controlled thickness so as to have the advantages heretofore described. The lower resistivity N-type regions 112 and 114 reduce the series resistance of the diode and provide ohmic contact with the conductor 125 as heretofore described.

Referring now to FIG. 7, a PNP transistor constructed in accordance with the present invention is indicated generally by the reference numeral 150. The transistor 150 is fabricated on a low-resistivity P-type substrate 152. A metallized collector contact 154 is deposited on one surface of the substrate. A P-type epitaxial layer 156 of high resistivity is formed over the other surface of the substrate 152. An oxide layer 158 is grown over the substrate to the desired thickness to provide a fiducial thickness marker and is then patterned to form a frame defining an opening 160 and expose a predetermined area of the P-type epitaxial layer 156. An N-type epitaxial layer 162 is then deposited over the substrate and forms an epitaxial plug 162*a* of a thickness which can be precisely determined from the thickness of the oxide layer and which can therefore be precisely controlled. Another oxide film 164 is then deposited over the substrate, preferably at a low temperature, and a P-type emitter region 166 diffused through an opening cut by photolithographic techniques in the oxide film. The depth of the emitter diffusion 166 may be very shallow and may be precisely controlled so as to retain control of the base width of the transistor. The oxide film 164 is again patterned by photolithographic and etching techniques to expose the base region 162*a* and the emitter region 166 and a metallized film deposited over the substrate. The metallized film is then patterned by conventional photolithographic and etch techniques to leave expanded base and emitter contacts 168 and 170.

If desired, the emitter region may also be formed epitaxially using the same process as is used to form the base region to provide an edge isolated transistor. Also, the transistor can have a planar configuration merely by making contact through the oxide layers 158 and 164 to the collector region 156.

In U.S. application Ser. No. 422,774, filed on Dec. 31, 1964 entitled UNITARY SEMICONDUCTOR DEVICE, now U.S. Pat. No. 3,463,975 issued Aug. 26, 1969, which is assigned to the assignee of the present invention, a PN junction in a semiconductor transistor device is prevented from becoming forward biased by shunting the junction with a metal-semicondcutor diode. This prevents the transistor from becoming saturated when the base is driven with large signals, thereby limiting the concentration of carriers stored in the base region and decreasing the time required to switch the transistor. In such a case, the diode is so constructed as to conduct in the forward direction at a lower voltage than the voltage required to cause the base collector junction to conduct in the same direction, In the above-referenced application, this is accomplished in an integrated configuration by interconnecting the base and collector regions with a metallized film which forms a rectifying junction with the high resistivity collector region while forming an ohmic contact with the lower resistivity base region. However, such a configuration has heretofore been limited to an NPN-type transistor because the high resistivity P-type collector region of a PNP transistor is not satisfactory for making the metal-semicondcutor diode, and there is no high-resistivity N-type region available from which to form the metal-semiconductor diode.

However, using the method of the present invention, such a device having a PNP transistor can be fabricated, and such a device is indicated generally by the reference numeral 200 in the sectional view of FIG. 8 and in the schematic circuit diagram of FIG. 8*a*. The device 200 is comprised of a metallized film 202 which serves as the collector contact, a low-resistivity P-type substrate 204, and a higher resistivity P-type epitaxial layer 206. An N-type base region 208 is formed in the epitaxial layer 206 and then a P-type emitter region 210 is diffused into the base region 208, using conventional diffusion techniques. The oxide film over the substrate, and in particular that portion of the oxide film over the base region 208, can be precisely measured. The oxide film 212 is then patterned by photolithographic and etching techniques to provide a window frame about an opening 214 over the base region 208. An epitaxial layer 216 is then formed over the surface of the substrate and forms an epitaxial plug 216*a* within the opening 214. The thickness of the epitaxial layer 216 may be precisely controlled by reference to the thickness of the oxide layer 212. A second oxide layer 218 is formed over the entire substrate, preferably by oxidative techniques, rather than thermal techniques, so as to keep the temperature at a sufficiently low temperature as not to materially disturb the diffusions previously established in forming the base and emitter regions 208 and 210. The oxide layer 218 is then patterned using conventional photolithographic and etching techniques to expose the surfaces of the epitaxial plug 216*a*, the base region 208 and the emitter region 210 and a metallized film deposited over the surface of the substrate. When the metallized film is patterned by photolithographic and etching techniques, an anode contact 220 for the diode, a base contact 222 and an emitter contact 224 remain. It is important that the metallized film forming the three contacts be such as to provide a rectifying junction between the metal and the high-resistivity N-type epitaxial plug 216*a* while at the same time forming an ohmic contact with the lower resistivity base and emitter regions 208 and 210. Molybdenum and/or gold may be used for this purpose. Then by merely connecting the anode contact 220 to the collector contact 202 the circuit illustrated in FIG. 8*a* is provided. In FIG. 8*a* the corresponding conductors are designated by corresponding reference numerals. In operation, the metal-semiconductor diode formed between the metallized contact 220 and the epitaxial plug 216*a* has a lower forward conduction voltage than does the junction between the collector region 206 and base region 208 so that the collector-base junction of the transistor can never become forward biased regardless of the magnitude of the signal used to drive the base.

Although preferred illustrative embodiments of the invention have been described in detail, it is to be understood that various changes, substitutions and alterations can be made in the embodiments described without departing from the spirit and scope of the invention as defined by the appended claims.

What is claimed is:

1. A method of fabricating a plurality of metal-semicondcutor devices, comprising the steps of:
   a. forming a first oxide layer over at least one surface of a low-resistivity monocrystalline semiconductor substrate of one conductivity type;
   b. monitoring the formation of said oxide layer and adjusting the parameters of the oxide-forming process to produce said oxide layer having a preselected thickness;
   c. photolithographically defining and removing selected areas of said oxide layer to expose a plurality of geometrically shaped areas of said substrate and to produce geometrically shaped bands of said oxide layer respectively circumscribing said geometrically shaped areas, each of said geometrically shaped areas having an area substantially smaller than the area of its respective band of oxide;
   d. epitaxially depositing a high resistivity semiconductor material of said one conductivity type over said geometrically shaped areas to a thickness substantially equal to the thickness of said geometrically shaped bands of oxide to produce a plurality of semiconductor plugs, said thickness of said semiconductor plugs being substantially equal to or less than the depletion width of the semicondcutor material thereof;
   e. monitoring the epitaxial deposition of said semiconductor plugs relative to the thickness of said geometrically shaped bands of oxide and adjusting the parameters of the epitaxial deposition process to produce said semiconductor plugs having said preselected thickness;
   f. forming a second oxide layer over said geometrically shaped bands of oxide and semiconductor plugs;
   g. photolithographically defining and removing a selected area of said second oxide layer to expose the surface area of each of said semiconductor plugs;
   h. selectively depositing a nonalloying metallized film over said second oxide layer to form rectifying contact with each of said semiconductor plugs; and
   i. selectively removing portions of said nonalloying metallized film to form a plurality of conductive strips respectively extending into contact with said semiconductor plugs; said conductive strips being selectively interconnected to produce said metal-semiconductor devices.

2. The method of claim 1, wherein said oxide deposition is optically monitored, and said epitaxial deposition is mechanically monitored.

3. The method of claim 1 wherein said oxide layer is thermally formed over said substrate, 4. The method of claim 1 wherein said one conductivity of said semiconductor substrate and said semiconductor plug is N-type.

5. The method of claim 1 wherein said first oxide layer is thermally formed over said substrate, and said second oxide layer is formed by a low-temperature process to minimize diffusion of said semiconductor plug from said substrate and to minimize concentration of impurities in said semiconductor plug along its surface.

6. A method of fabricating a semicondcutor device of the type that includes a metal-semiconductor diode, comprising the steps of:
   a. forming an elongated low-resistivity diffused region within a high-resistivity semiconductor substrate;
   b. forming a first oxide layer over at least one surface of said substrate;
   c. monitoring the formation of said first oxide layer and adjusting the parameters of the oxide-forming process to produce a preselected thickness;
   d. photolithographically defining and removing a selected area of said first oxide layer to expose an elongated area of said diffused region and to produce an oxide band that circumscribes the exposed elongated area of said diffused region;
   e. epitaxially depositing a high-resistivity semiconductor material over the exposed area of said diffused region to a thickness substantially equal to the thickness of said oxide band to produce an elongated plug of said semiconductor material, said thickness of said elongated plug being substantially equal to or less than the depletion width of the semiconductor material thereof;
   f. monitoring the epitaxial deposition of said elongated plug relative to the thickness of said oxide band and adjusting the parameters of the epitaxial deposition process to produce said elongated plug having said preselected thickness;
   g. forming a second oxide layer over said elongated plug and oxide band;
   h. photolithographically defining and removing a selected area of said second oxide layer to expose the surface area of said elongated plug;
   i. photolithographically defining and removing selected areas of said first and second oxide layers to selectively expose said diffused region;
   j. depositing a nonalloying metallized film over said second oxide layer to form a rectifying contact with said elongated plug and to form an ohmic contact with said latter exposed areas of said diffused region; and
   k. selectively removing portions of said nonalloying metallized film to form a first conductive strip extending into selective contact with said diffused region and to form a second conductive strip extending into contact with said elongated plug.

7. A method of fabricating a semiconductor device of the type that includes a metal-semiconductor diode, comprising the steps of:
   a. diffusing first and second spaced regions of one conductivity type into a monocrystalline semiconductor substrate of opposite conductivity type, said first and second spaced regions having impurity concentrations suitable for a collector region;
   b. diffusing a base region of said opposite conductivity type into said first diffused region;
   c. diffusing a third region of said one conductivity type into said base region and diffusing a fourth region of said one conductivity type into said second region, said third and fourth regions having an impurity concentration suitable for use as an emitter region;
   d. forming a first oxide layer over the surface of said substrate;
   e. monitoring the formation of said first oxide layer and adjusting the parameters of the oxide-forming process to produce a preselected thickness;
   f. photolithographically defining and removing a selected area of said first oxide layer to expose an area of said second region to produce an oxide band circumscribing said exposed area of said second region;
   g. epitaxially depositing a high-resistivity semiconductor material over said exposed area of said second region to a thickness substantially equal to the thickness of said oxide band to produce a semiconductor plug, said thickness of said semiconductor plug being substantially equal to or less than the depletion width of the semiconductor material therein;

h. monitoring the epitaxial deposition of said semiconductor plug relative to the thickness of said oxide band and adjusting the parameters of the epitaxial deposition process to produce said semiconductor plug having said preselected thickness;

i. forming a second oxide layer over said oxide band and semiconductor plug; and j. photolithographically defining and removing selected areas of said second oxide layer to expose said semiconductor plug, and to remove selected areas of said first and second oxide layers to expose said first, third, fourth and base regions;

k. selectively depositing a nonalloying metallized film over said substrate to make rectifying contact with said semiconductor plug to form said metal-semiconductor diode, and to make ohmic contact with said first, third, fourth and base regions; and l. selectively removing said nonalloying metallized film to form separated strip conductors respectively contacting said semiconductor plug and said active regions.

8. A method of fabricating a semiconductor device comprising the steps of:

a. forming a first oxide layer over at least one surface of a monocrystalline semiconductor substrate of one conductivity type having an impurity concentration suitable for use as a collector region of a transistor;

b. monitoring the formation of said first oxide layer and adjusting the parameters of the oxide-forming process to produce a preselected thickness;

c. photolithographically defining and removing selected areas of said first oxide layer to expose at least one geometrically shaped area of said substrate and to produce a geometrically shaped band of said first oxide layer that circumscribes said geometrically shaped area;

d. epitaxially depositing a semiconductor material of opposite conductivity type with an impurity concentration suitable for use as the base region of a transistor within said geometrically shaped area to a thickness substantially equal to the thickness of said geometrically shaped band to produce a semiconductor plug, said thickness of said semiconductor plug being substantially equal to or less than the depletion width of the semiconductor material thereof;

e. monitoring the epitaxial deposition of said semiconductor plug relative to the thickness of said geometrically shaped band and adjusting the parameters of the epitaxial deposition process to produce said semiconductor plug having said preselected thickness;

f. forming an emitter region of said one conductivity type within said semiconductor plug;

g. forming a second oxide layer over said semiconductor plug;

h. photolithographically defining and removing a selected area of said second oxide to expose a selected area of said emitter region and a selected area of said semiconductor plug; and i. selectively depositing a nonalloying metallized film over said exposed areas of said semiconductor plug and emitter region to form electrical contact therewith.

9. A method of fabricating a semiconductor device of the type that includes a metal-semiconductor diode, comprising the steps of:

a. forming a planar-type transistor device by successively diffusing a base region of one conductivity type and an emitter region of opposite conductivity type into a monocrystalline substrate of said opposite conductivity type serving as a collector region;

b. forming a first oxide layer over said substrate;

c. monitoring the formation of said first oxide layer and adjusting the parameters of the oxide-forming process to produce a preselected thickness;

d. photolithographically defining and removing a selected area of said first oxide layer to expose a selected area of said base region to produce an oxide band that circumscribes the exposed area of said base region;

e. epitaxially depositing a high resistivity semiconductor material over the exposed area of said base region to a thickness substantially equal to the thickness of said oxide band to produce a semiconductor plug, said thickness of said semiconductor plug being substantially equal to or less than the depletion width of the semiconductor material thereof;

f. monitoring the epitaxial deposition of said semiconductor plug relative to the thickness of said oxide band and adjusting the parameters of the epitaxial deposition process to produce said semiconductor plug having said preselected thickness;

g. forming a second oxide layer over said semiconductor plug and said oxide band;

h. photolithographically defining and removing a selected area of said second oxide layer to expose said semiconductor plug;

i. photolithographically defining and removing selected areas of said first and second oxide layers to expose said base and emitter regions; and j. selectively depositing a nonalloying metallized film over the exposed areas of said semiconductor plug and said base and emitter regions to form a rectifying contact with said semiconductor plug and to form an ohmic contact with said base and emitter regions.

10. A method of fabricating a semiconductor device of the type that includes a metal-semiconductor diode, comprising the steps of:

a. diffusing a first region of one conductivity type into low-resistivity monocrystalline semiconductor substrate of opposite conductivity type;

b. diffusing a second region of said one conductivity type into said first region, said second region having a lower resistivity than said first region;

c. forming a first oxide layer over the surface of said substrate;

d. monitoring the formation of said first oxide layer and adjusting the parameters of the oxide-forming process to produce a preselected thickness;

e. photolithographically defining and removing a selected area of said first oxide layer to expose an area of said first region to produce an oxide band circumscribing said exposed area of said first region;

f. epitaxially depositing a high-resistivity semiconductor material over said exposed area of said first region to a thickness substantially equal to the thickness of said oxide band to produce a semiconductor plug, said thickness of said semiconductor plug being substantially equal to or less than the depletion width of the semiconductor material therein;

g. monitoring the epitaxial deposition of said semiconductor plug relative to the thickness of said oxide band and adjusting the parameters of the epitaxial deposition process to produce said semiconductor plug having said preselected thickness;

h. forming a second oxide layer over said oxide band and semiconductor plug;

i. photolithographically defining and removing selected areas of said second oxide layer to expose said semiconductor plug, and to remove a selected area of said first and second oxide layers to expose said second region;

j. selectively depositing a nonalloying metallized film over said substrate to make rectifying contact with said semiconductor plug to form the anode of said metal-semiconductor diode, and to make ohmic contact with said second region to form the cathode of said metal-semiconductor diode; and k. selectively removing said nonalloying metallized film to form separate strip conductors respectively contacting said semiconductor plug and said second region.